(12) United States Patent
Brochu, Jr. et al.

(10) Patent No.: US 8,587,383 B2
(45) Date of Patent: Nov. 19, 2013

(54) MEASURING BIAS TEMPERATURE INSTABILITY INDUCED RING OSCILLATOR FREQUENCY DEGRADATION

(75) Inventors: David G. Brochu, Jr., East Hardwick, VT (US); Dimitris P. Ioannou, South Burlington, VT (US); Travis S. Merrill, Rutland, VT (US); Steven W. Mittl, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 13/313,416

(22) Filed: Dec. 7, 2011

(65) Prior Publication Data

US 2013/0147562 A1 Jun. 13, 2013

(51) Int. Cl.
*G01R 23/00* (2006.01)
*G01R 31/3187* (2006.01)
*H03K 3/03* (2006.01)

(52) U.S. Cl.
USPC ............. 331/44; 331/57; 331/185; 324/750.3

(58) Field of Classification Search
USPC ............. 324/750.3, 762.02; 331/44, 57, 176, 331/185, 186
See application file for complete search history.

(56) References Cited

U.S. PATENT DOCUMENTS

| | | | |
|---|---|---|---|
| 5,625,288 A * | 4/1997 | Snyder et al. | 324/750.06 |
| 6,216,099 B1 * | 4/2001 | Fang et al. | 703/15 |
| 6,476,632 B1 | 11/2002 | La Rosa et al. | |
| 6,693,434 B2 * | 2/2004 | Chetlur et al. | 324/520 |
| 6,731,179 B2 | 5/2004 | Abadeer et al. | |
| 7,126,365 B2 | 10/2006 | Suzuki | |
| 7,190,233 B2 | 3/2007 | Bhushan et al. | |
| 7,456,628 B2 | 11/2008 | Suzuki | |
| 7,531,836 B2 | 5/2009 | Liu et al. | |
| 7,642,864 B2 | 1/2010 | Chuang et al. | |
| 7,689,377 B2 | 3/2010 | Jain et al. | |
| 7,868,640 B2 | 1/2011 | Agarwal et al. | |
| 2010/0115475 A1 | 5/2010 | Buonpane et al. | |
| 2011/0074394 A1 | 3/2011 | Gebara et al. | |
| 2011/0090015 A1 | 4/2011 | Sumita et al. | |
| 2011/0173432 A1 | 7/2011 | Cher et al. | |
| 2013/0015876 A1 * | 1/2013 | Lai et al. | 324/762.01 |

OTHER PUBLICATIONS

Ioannou et al., "A robust reliability methodology for accurately predicting Bias Temperature Instability induced circuit performance degradation in HKMG CMOS" Reliability Physics Symposium (IRPS), 2011 IEEE International Digital Object Identifier, Publication Year: 2011 , pp. CR.1.1-CR.1.4.

Reisinger et al., "A Comparison of Fast Methods for Measuring NBTI Degradation", IEEE Transactions on vol. 7 , Issue: 4, Publication Year: 2007 , pp. 531-539.

(Continued)

*Primary Examiner* — Levi Gannon
(74) *Attorney, Agent, or Firm* — Gibb & Riley, LLC; Michael J. LeStrange, Esq.

(57) ABSTRACT

A method establishes an initial voltage in a ring oscillator and a logic circuit of an integrated circuit device. Following this, the method enables the operating state of the ring oscillator. After enabling the operating state of the ring oscillator, the method steps up to a stressing voltage in the ring oscillator. The initial voltage is approximately one-half the stressing voltage. The stressing voltage creates operating-level stress within the ring oscillator. The method measures the operating-level frequency within the ring oscillator using an oscilloscope (after stepping up to the stressing voltage).

20 Claims, 3 Drawing Sheets

(56) References Cited

OTHER PUBLICATIONS

Oner et al., "A compact monitoring circuit for real-time on-chip diagnosis of hot-carrier induced degradation", Proceedings. IEEE International Conference on Digital Object Identifier, Publication Year: 1997, pp. 72-76.

Disclosed Anonymously, IPCOM000198592D: "Circuit and Methodology for Stressing Transistors for NBTI and TDDB and Differentiating the Circuit Effects of NBTI and TDDB" Aug. 10, 2010, pp. 1-7.

U.S. Appl. No. 13/009,649, filed Jan. 19, 2011, entitled "Monitoring Negative Bias Temperature Instability (NBTI) and/or Positive Bias Temperature Instability (pbti)".

* cited by examiner

MEASURING BIAS TEMPERATURE INSTABILITY INDUCED RING OSCILLATOR FREQUENCY DEGRADATION

BACKGROUND

The present disclosure relates to measuring bias temperature instability induced ring oscillator frequency degradation, and more specifically, to methods that, after enabling an operating state of a ring oscillator, steps up from an initial voltage to a stressing voltage in the ring oscillator, where the initial voltage is approximately one-half the stressing voltage.

Both negative and positive transistor bias temperature instability (BTI) is a major reliability concern for advanced complementary metal oxide semiconductor (CMOS) technologies. Bias temperature instability causes device threshold voltage drift and output current degradation, which degrades circuit performance degradation over time. Bias temperature instability is extremely challenging to measure accurately and conventional methods that characterize the effect of bias temperature instability on circuits have focused on investigating various circuit topologies.

SUMMARY

One exemplary method herein establishes an initial voltage in a ring oscillator and a logic circuit of an integrated circuit device. Following this, the method enables the operating state of the ring oscillator. After enabling the operating state of the ring oscillator, the method steps up to a stressing voltage in the ring oscillator. The initial voltage is approximately one-half the stressing voltage. The stressing voltage creates operating-level stress within the ring oscillator. The method measures the operating-level frequency within the ring oscillator using an oscilloscope (after stepping up to the stressing voltage).

Another exemplary method herein sets a ring oscillator and a logic circuit of an integrated circuit device to a reference zero voltage. Next, this exemplary method establishes an initial voltage in the ring oscillator and the logic circuit. Following this, the method enables the operating state of the ring oscillator. After enabling the operating state of the ring oscillator, the method steps up to a stressing voltage in the ring oscillator. The initial voltage is approximately one-half the stressing voltage. The stressing voltage creates operating-level stress within the ring oscillator. The method measures the operating-level frequency within the ring oscillator using an oscilloscope (after stepping up to the stressing voltage). After measuring the operating-level frequency, the method steps down to the initial voltage in the ring oscillator. The process of stepping up to the stressing voltage comprises increasing the voltage supplied to the ring oscillator in at least two steps of different voltages. The pattern of stepping down to the initial voltage matches a reverse pattern of stepping up to the stressing voltage.

Another exemplary method herein sets a ring oscillator and a logic circuit of an integrated circuit device to a reference zero voltage. Next, this exemplary method establishes an initial voltage in the ring oscillator and the logic circuit. Following this, the method enables the operating state of the ring oscillator. After enabling the operating state of the ring oscillator, the method steps up to a stressing voltage in the ring oscillator. The initial voltage is approximately one-half the stressing voltage. The stressing voltage creates operating-level stress within the ring oscillator. The method measures the operating-level frequency within the ring oscillator using an oscilloscope (after stepping up to the stressing voltage). After measuring the operating-level frequency the method steps down to the initial voltage in the ring oscillator. The process of stepping up to the stressing voltage comprises increasing the voltage supplied to the ring oscillator in at least two steps of different voltages.

A non-volatile computer storage medium embodiment herein is readable by a computerized device. The computer storage medium tangibly stores instructions executable by the computerized device. The instructions cause the computerized device to perform a method that establishes an initial voltage in a ring oscillator and a logic circuit of an integrated circuit device. Following this, the method enables the operating state of the ring oscillator. After enabling the operating state of the ring oscillator, the method steps up to a stressing voltage in the ring oscillator. The initial voltage is approximately one-half the stressing voltage. The stressing voltage creates operating-level stress within the ring oscillator. The method measures the operating-level frequency within the ring oscillator using an oscilloscope (after stepping up to the stressing voltage).

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, bias temperature instability is extremely challenging to measure accurately. One reason is because there is a very rapid stress relaxation, and because it is difficult to accurately measure an initial frequency value at the stress bias (f0). The systems and methods herein address these issues by utilizing a standard ring oscillator circuit and focusing on addressing bias temperature instability measurement challenges on the circuit level.

By using a standard ring oscillator circuit and focusing on measurement on the circuit level, this provides an ultra-fast on-the-fly ring oscillator measurement to accurately probe into bias temperature instability effects on circuit performance degradation. More specifically, the methods herein provide ultra fast (~us) bias transition to stress bias level and thus accurate time-zero frequency measurement at the stress bias, (f0), and on-the fly (in situ) measurements to avoid any measurement-induced relaxation. The frequency degradation characteristics obtained shows all of the same signatures of fast bias temperature instability device stresses.

Figures 1, 2:
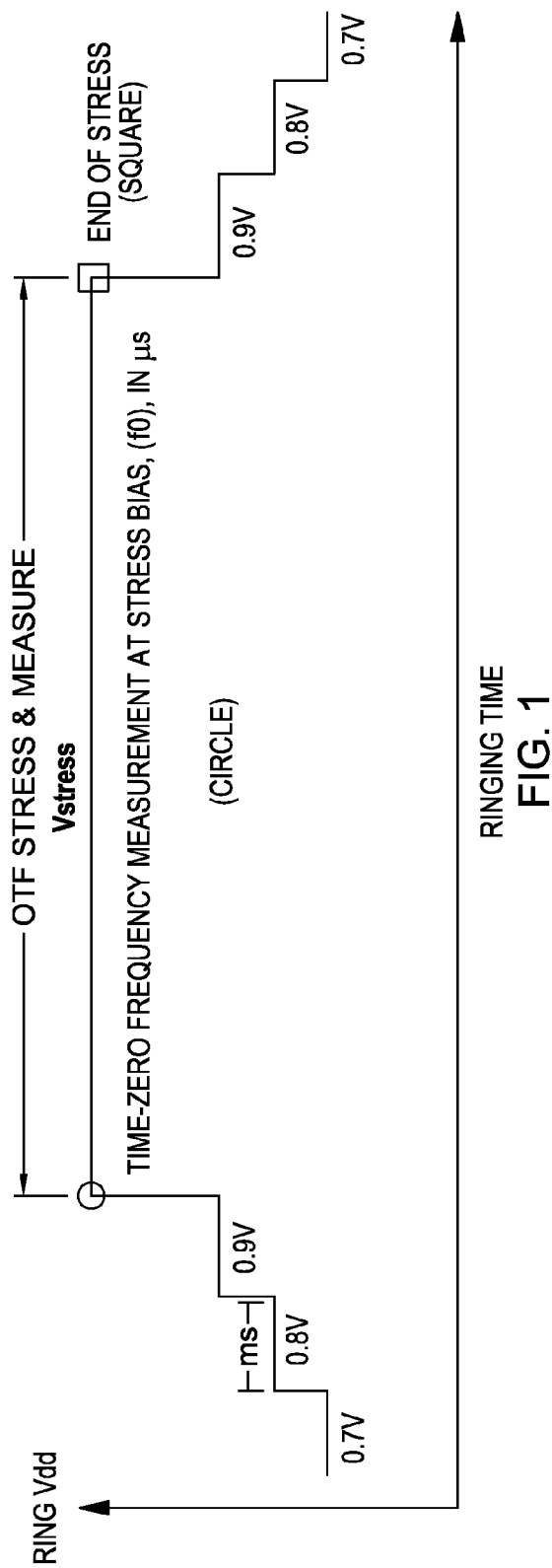
FIG. 1 is a schematic diagram illustrating embodiments herein.
FIG. 2 is a schematic diagram illustrating embodiments herein.

The methods herein provide an optimized bias sequence that prevents overshoot/undershoot related damage and relates to the physical design. More specifically, as shown in FIG. 1, during the enablement phase (~ms) this method establishes stable operation (e.g., 0.5V-0.6V). Next, these methods provide an ultra-fast transition (0.7V, 0.8V, 0.9V steps) to the stress phase (1.0V-1.25V) and time-zero frequency measurement, (f0), within few micro seconds. During the on-the-fly (OTF) stress and measure (Vstress) stage, the methods herein periodically monitor of frequency at Vstress, providing in situ readouts of f(t).

Thus, as shown in the table in FIG. 2, step 0 is the zero voltage starting point. At step 1 the methods herein establish the initial voltages for the ring oscillator (Ring Vdd) and the logic circuit voltage (logic Vdd). The initial voltages are low enough to ensure stable operation but not high enough to contribute significant BTS stress, and are approximately one-half (e.g., 0.5-0.6×) normal operating voltage. In step 2, the method enables the ring oscillator to start the oscillator ringing. In step 3, the method prepares the ring oscillator for stress by raising the enable voltage (as shown in FIG. 1) to Vstress. Next, in step 4 the method keeps the voltage at Vstress to create ring oscillator stress and the oscilloscope is triggered on the rising edge of Ring Vdd to capture initial cycles at Vstress for f0 calculation. Further, the oscilloscope is triggered periodically after step 4 for in situ readouts of f(t).

By doing so, the methods herein provide near trap-free time-zero circuit performance assessment, which provides an accurate predictor of end-of-line (EOL) circuit performance. The embodiments described herein provide very realistic EOL Projections/BTI guardband (i.e., server chip) and can be used for burn-in type of stress and high temperature anneal induced recovery characterization.

Figure 3:
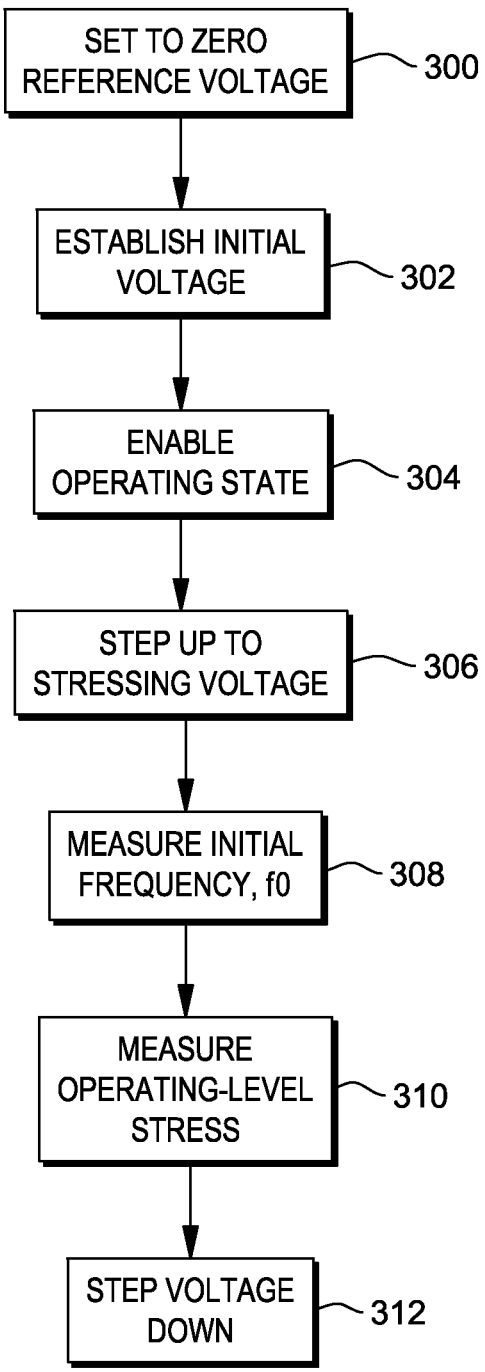
FIG. 3 is a flow diagram illustrating embodiments herein.

FIG. 3 is a flowchart illustrating an exemplary method that sets a ring oscillator and a logic circuit of an integrated circuit device to a reference zero voltage in item 300. Next, this exemplary method establishes an initial voltage in the ring oscillator and the logic circuit in item 302. The initial voltages are approximately one-half the stressing voltage. The zero voltage, the initial voltages, and the stressing voltage are different voltages. After establishing the initial voltages, in item 302, the method enables the operating state of the ring oscillator in item 304.

After enabling the operating state of the ring oscillator, the method steps up to a stressing voltage in the ring oscillator in item 306. The stepping up to the stressing voltage comprising increasing voltage supplied to the ring oscillator in at least two steps of different voltages. The stepping up to the stressing voltage comprising increasing voltage supplied to the ring oscillator while maintaining the initial voltage supplied to the logic circuit. the stepping up to the stressing voltage being performed in less than 10 microseconds. Within this time the measurement of time-zero frequency at stress level, f0, is performed (item 308).

The stressing voltage creates operating-level stress within the ring oscillator. The method measures the operating-level frequency within the ring oscillator using an oscilloscope (after stepping up to the stressing voltage) in item 310. The method can periodically measure the operating-level frequency within the ring oscillator using the oscilloscope while the stressing voltage is being applied to the ring oscillator in item 310.

After measuring the operating-level frequency, the method steps down to the initial voltage in the ring oscillator in item 312. The process of stepping up to the stressing voltage comprises increasing the voltage supplied to the ring oscillator in at least two steps of different voltages. The pattern of stepping down to the initial voltage matches a reverse pattern of stepping up to the stressing voltage.

As will be appreciated by one skilled in the art, aspects of the systems and methods herein may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
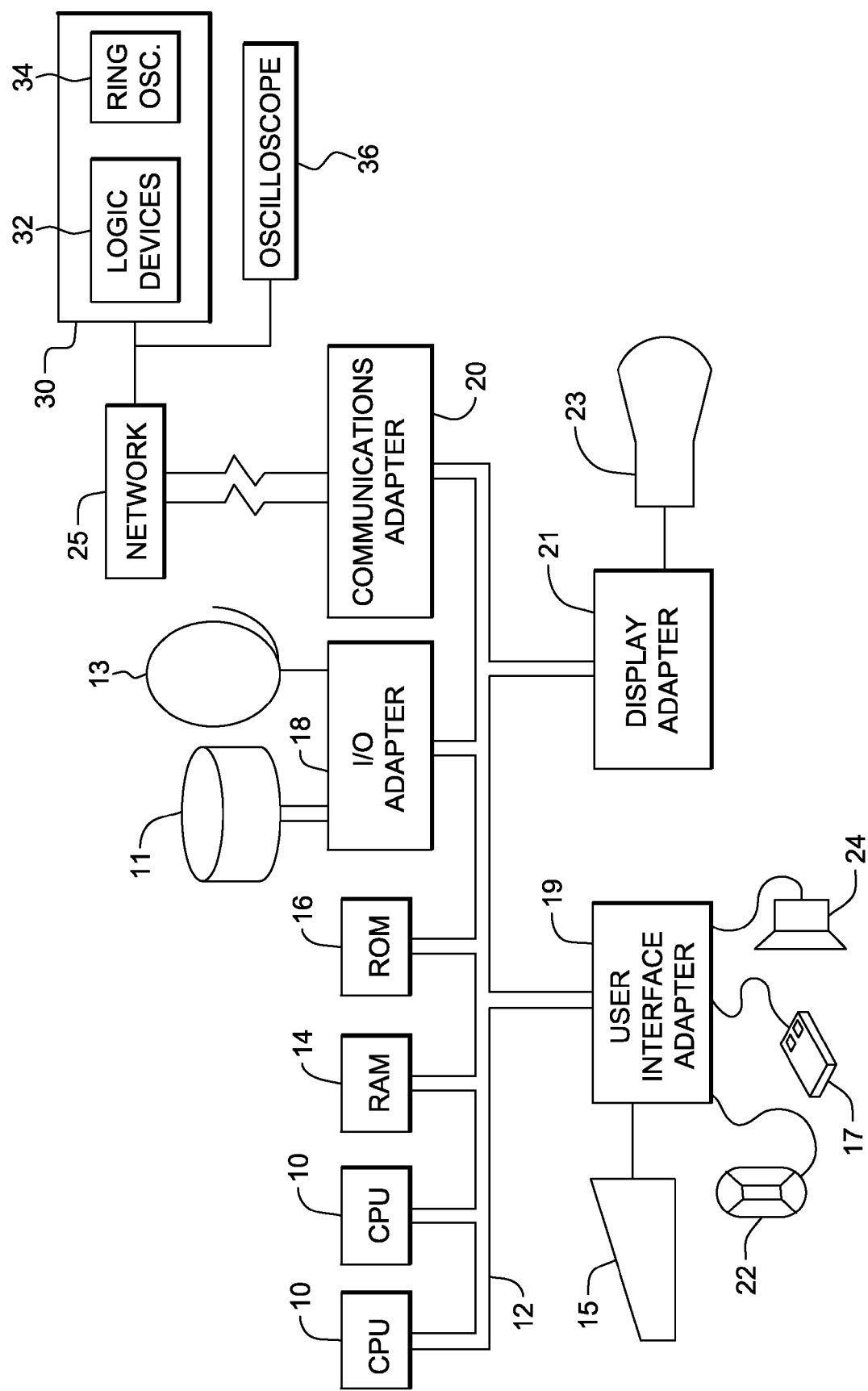
FIG. 4 is a schematic diagram of a hardware system according to embodiments herein.

A representative hardware environment for practicing the embodiments herein is depicted in FIG. 4. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Thus, the non-volatile computer storage medium 16 is readable by the CPU 10. The computer storage medium 16 tangibly stores instructions executable by the CPU 10. The instructions cause the CPU 10 to perform above methods to determine bias temperature instability on the integrated circuit device 30 that is operatively connected to the CPU 10 through the various components shown in FIG. 4. More specifically, as described above, such a method sets the ring oscillator 34 and a logic circuit 32 of an integrated circuit device 30 to a reference zero voltage. Next, this exemplary method establishes an initial voltage in the ring oscillator 34 and the logic circuit 32, and (after the establishing of the initial voltage) measures the initial stress within the ring oscillator 34 using an oscilloscope 36. Following this, the method enables the operating state of the ring oscillator 34. After enabling the operating state of the ring oscillator 34, the method steps up to a stressing voltage in the ring oscillator 34. The initial voltage is approximately one-half the stressing voltage. The stressing voltage creates operating-level stress within the ring oscillator 34. The method measures the operating-level frequency within the ring oscillator 34 using an oscilloscope 36 (after stepping up to the stressing voltage). After measuring the operating-level frequency, the method steps down to the initial voltage in the ring oscillator 34. The process of stepping up to the stressing voltage comprises increasing the voltage supplied to the ring oscillator 34 in at least two steps of different voltages.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    establishing an initial voltage in a ring oscillator and a logic circuit of an integrated circuit device;
    enabling an operating state of said ring oscillator;
    stepping up to a stressing voltage in said ring oscillator, said initial voltage being approximately one-half said stressing voltage, said stressing voltage creating operating-level stress within said ring oscillator; and
    measuring an operating-level frequency within said ring oscillator using an oscilloscope after said stepping up to said stressing voltage,
    said stepping up to said stressing voltage comprising increasing voltage supplied to said ring oscillator in at least two steps of different voltages, and
    said stepping up using at least one voltage between said initial voltage and said stressing voltage.

2. The method according to claim 1, said stepping up to said stressing voltage comprising increasing voltage supplied to said ring oscillator in at least four steps of different voltages.

3. The method according to claim 1, said stepping up to said stressing voltage comprising increasing voltage supplied to said ring oscillator while maintaining said initial voltage supplied to said logic circuit.

4. The method according to claim 1, further comprising periodically measuring said operating-level frequency within said ring oscillator using said oscilloscope while said stressing voltage is being applied to said ring oscillator.

5. The method according to claim 1, said stepping up to said stressing voltage being performed in less than 10 microseconds.

6. A method comprising:
   setting a ring oscillator and a logic circuit of an integrated circuit device to a reference zero voltage;
   establishing an initial voltage in said ring oscillator and said logic circuit;
   enabling an operating state of said ring oscillator;
   stepping up to a stressing voltage in said ring oscillator, said initial voltage being approximately one-half said stressing voltage, said stressing voltage creating operating-level stress within said ring oscillator;
   measuring an operating-level frequency within said ring oscillator using an oscilloscope after said stepping up to said stressing voltage; and
   stepping down to said initial voltage in said ring oscillator after said measuring,
   said stepping up to said stressing voltage comprising increasing voltage supplied to said ring oscillator in at least two steps of different voltages,
   said stepping up using at least one voltage between said initial voltage and said stressing voltage,
   said stepping down to said initial voltage comprising decreasing voltage supplied to said ring oscillator in at least two steps of different voltages, and
   said stepping down using at least one voltage between said stressing voltage and said initial voltage.

7. The method according to claim 6, said zero voltage, said initial voltage, and said stressing voltage comprising different voltages.

8. The method according to claim 6, said stepping up to said stressing voltage comprising increasing voltage supplied to said ring oscillator while maintaining said initial voltage supplied to said logic circuit.

9. The method according to claim 6, further comprising periodically measuring said operating-level frequency within said ring oscillator using said oscilloscope while said stressing voltage is being applied to said ring oscillator.

10. The method according to claim 6, said stepping up to said stressing voltage being performed in less than 10 microseconds.

11. A method comprising:
    setting a ring oscillator and a logic circuit of an integrated circuit device to a reference zero voltage;
    establishing an initial voltage in said ring oscillator and said logic circuit;
    measuring initial frequency within said ring oscillator using an oscilloscope after said establishing of said initial voltage;
    enabling an operating state of said ring oscillator;
    stepping up to a stressing voltage in said ring oscillator after enabling said operating state of said ring oscillator, said initial voltage being approximately one-half said stressing voltage, said stressing voltage creating operating-level stress within said ring oscillator;
    measuring an operating-level frequency within said ring oscillator using an oscilloscope after said stepping up to said stressing voltage; and
    stepping down to said initial voltage in said ring oscillator after said measuring,
    a pattern of said stepping down to said initial voltage matching a reverse pattern of said stepping up to said stressing voltage, and
    said stepping up to said stressing voltage comprising increasing voltage supplied to said ring oscillator in at least two steps of different voltages,
    said stepping up using at least one voltage between said initial voltage and said stressing voltage,
    said stepping down to said initial voltage comprising decreasing voltage supplied to said ring oscillator in at least two steps of different voltages, and
    said stepping down using at least one voltage between said stressing voltage and said initial voltage.

12. The method according to claim 11, said zero voltage, said initial voltage, and said stressing voltage comprising different voltages.

13. The method according to claim 11, said stepping up to said stressing voltage comprising increasing voltage supplied to said ring oscillator while maintaining said initial voltage supplied to said logic circuit.

14. The method according to claim 11, further comprising periodically measuring said operating-level frequency within said ring oscillator using said oscilloscope while said stressing voltage is being applied to said ring oscillator.

15. The method according to claim 11, said stepping up to said stressing voltage being performed in less than 10 microseconds.

16. A tangible computer storage medium readable by a computerized device, said computer storage medium tangibly storing instructions executable by said computerized device, said instructing causing said computerized device to perform a method comprising:
    establishing an initial voltage in a ring oscillator and a logic circuit of an integrated circuit device;
    enabling an operating state of said ring oscillator;
    stepping up to a stressing voltage in said ring oscillator, said initial voltage being approximately one-half said stressing voltage, said stressing voltage creating operating-level stress within said ring oscillator; and
    measuring an operating-level frequency within said ring oscillator using an oscilloscope after said stepping up to said stressing voltage,
    said stepping up to said stressing voltage comprising increasing voltage supplied to said ring oscillator in at least two steps of different voltages, and
    said stepping up using at least one voltage between said initial voltage and said stressing voltage.

17. The computer storage medium according to claim 16, said stepping up to said stressing voltage comprising increasing voltage supplied to said ring oscillator in at least four steps of different voltages.

18. The computer storage medium according to claim 16, said stepping up to said stressing voltage comprising increasing voltage supplied to said ring oscillator while maintaining said initial voltage supplied to said logic circuit.

19. The computer storage medium according to claim 16, said method further comprising periodically measuring said operating-level frequency within said ring oscillator using said oscilloscope while said stressing voltage is being applied to said ring oscillator.

20. The computer storage medium according to claim 16, said stepping up to said stressing voltage being performed in less than 10 microseconds.

* * * * *